(12) United States Patent
Saini et al.

(10) Patent No.: US 12,532,722 B2
(45) Date of Patent: Jan. 20, 2026

(54) PROCESS FOR DEVELOPING FINE OPENINGS IN A FLEXIBLE ELECTRONIC COMPONENT WITH A PLASMA-ETCHING TECHNIQUE

(71) Applicant: Tech-Etch, Inc., Plymouth, MA (US)

(72) Inventors: Gurinder S. Saini, Arlington, MA (US); David J. Crary, South Dennis, MA (US)

(73) Assignee: Tech-Etch, Inc., Plymouth, MA (US)

( * ) Notice: Subject to any disclaimer, the term of this patent is extended or adjusted under 35 U.S.C. 154(b) by 393 days.

(21) Appl. No.: 18/457,118

(22) Filed: Aug. 28, 2023

(65) Prior Publication Data

US 2024/0071824 A1    Feb. 29, 2024

Related U.S. Application Data

(60) Provisional application No. 63/373,967, filed on Aug. 30, 2022.

(51) Int. Cl.
| | | |
|---|---|---|
| *H01L 21/768* | (2006.01) |
| *H01L 21/027* | (2006.01) |
| *H01L 21/3065* | (2006.01) |
| *H01L 21/308* | (2006.01) |
| *H01L 21/311* | (2006.01) |
| *H01L 21/3213* | (2006.01) |

(52) U.S. Cl.
CPC .... *H01L 21/76895* (2013.01); *H01L 21/0274* (2013.01); *H01L 21/3065* (2013.01); *H01L 21/3081* (2013.01); *H01L 21/31144* (2013.01); *H01L 21/32139* (2013.01)

(58) Field of Classification Search
CPC .......................... H01L 21/3065–30655; H01L 21/32136–32137; H01L 21/02118–0212
See application file for complete search history.

(56) References Cited

U.S. PATENT DOCUMENTS

2024/0395741 A1* 11/2024 Su ........................... H01L 24/03

* cited by examiner

*Primary Examiner* — Amar Movva
(74) *Attorney, Agent, or Firm* — Nixon Peabody LLP

(57) ABSTRACT

A method of providing access to a contact pad located on a base polyimide layer of an electronic part comprises (i) covering the contact pad and the base polyimide layer with a cover layer comprised of a metallic mask layer, a polyimide layer, and an adhesive layer. The adhesive layer attaches the cover layer to the contact pad and the base polyimide layer. The metallic mask layer is exposed. The method further includes (ii) removing a portion of the metallic mask layer of the cover layer directly above the contact pad, and (iii) through the removed portion of the metallic mask layer, using a plasma-etching process to create an access opening to the contact pad through the polyimide layer and the adhesive layer.

24 Claims, 8 Drawing Sheets

PROCESS FOR DEVELOPING FINE OPENINGS IN A FLEXIBLE ELECTRONIC COMPONENT WITH A PLASMA-ETCHING TECHNIQUE

CROSS-REFERENCE TO RELATED APPLICATIONS

The present application claims the benefit of and priority to U.S. Provisional Application No. 63/373,967, filed Aug. 30, 2022, the contents of which are hereby incorporated by reference herein in their entirety.

COPYRIGHT

A portion of the disclosure of this patent document may contain material which is subject to copyright protection. The copyright owner has no objection to the facsimile reproduction by anyone of the patent disclosure, as it appears in the Patent and Trademark Office patent files or records, but otherwise reserves all copyright rights whatsoever

FIELD OF THE INVENTION

The present invention relates to etching process for forming electronic parts. More particularly, this invention relates to method of using a dry-etching methods with plasma to form fine holes or fine recesses in electronic parts.

BACKGROUND OF THE INVENTION

In prior systems, a photo-resist mask and wet etching solutions are used to selectively remove polyimide layers and associated adhesive layers of a cover layer that is located over a metal. However, the prior methods are not able to achieve very precise openings in the materials.

The present disclosure provides a method for producing fine openings over contact pads that are more precisely registered and have more consistent geometries and dimensions.

All these and other objects of the present invention will be understood through the detailed description of the invention below.

SUMMARY OF THE INVENTION

In one aspect, the present invention is directed to a cover layer that includes a polyimide layer, an adhesive layer, and a thin copper mask layer. The thin copper mask layer is etched to produce an opening. The opening in the copper layer permits access to a plasma-etching process that removes the polyimide layer and the adhesive layer, leading to an opening providing access to a contact pad on the electronic part.

In another aspect, the invention is a method of creating an opening that provides access to a contact pad via the plasma-etching process described below in the specification and also in the claims.

Additional aspects of the invention will be apparent to those of ordinary skill in the art in view of the detailed description of various embodiments, which is made with reference to the drawings, a brief description of which is provided below.

BRIEF DESCRIPTION OF THE DRAWINGS

The present invention will be described with greater specificity and clarity with reference to the following drawings, in which.

Figure 1A:
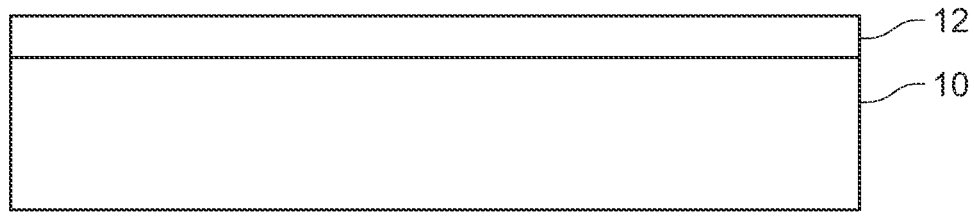
FIG. 1A illustrates a step in a process for creating a flexible electrical component.

While the invention is susceptible to various modifications and alternative forms, specific embodiments will be shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE DRAWINGS

The drawings will herein be described in detail with the understanding that the present disclosure is to be considered as an exemplification of the principles of the invention and is not intended to limit the broad aspect of the invention to the embodiments illustrated. For purposes of the present detailed description, the singular includes the plural and vice versa (unless specifically disclaimed); the words "and" and "or" shall be both conjunctive and disjunctive; the word "all" means "any and all"; the word "any" means "any and all"; and the word "including" means "including without limitation."

FIGS. 1A-1F illustrate one method for forming a pattern of copper onto a base layer of polyimide. The copper pattern includes both copper traces and copper contact pads. As used herein, the term "copper" refers to both copper and copper alloys. FIG. 1A illustrates a polyimide layer 10 with a thin copper layer 12 on its upper surface. The thickness of the polyimide layer 10 is typically in the range of 0.5 mil to 5 mils. The thickness of the copper layer 12 is typically in the range of 0.3 mil to 2.8 mils.

Figure 1B:
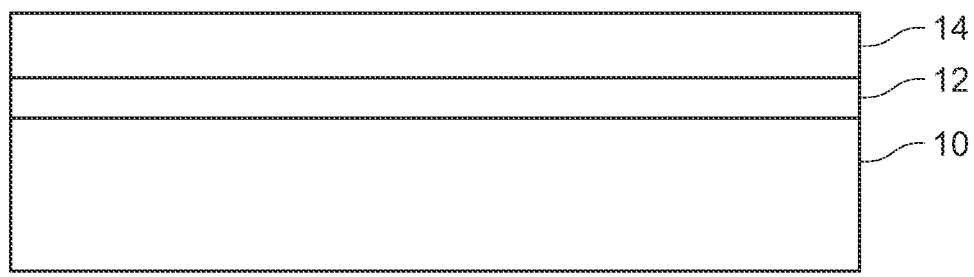
FIG. 1B illustrates a step in the process for creating the flexible electrical component that is subsequent to the step in FIG. 1A.

FIG. 1B illustrates a resist layer 14 placed over the copper layer 12. The resist layer 14 is exposed with UV light in a certain pattern, which polymerizes the resist layer 14 in that certain pattern. The uncured resist layer is developed off, leaving behind the desired pattern of the resist layer 14a located above the copper layer 12, as shown in FIG. 1C.

Figure 1C:
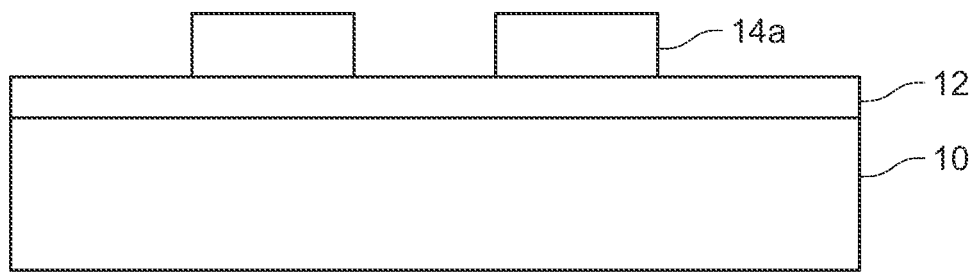
FIG. 1C illustrates a step in the process for creating the flexible electrical component that is subsequent to the step in FIG. 1B.
Figure 1D:
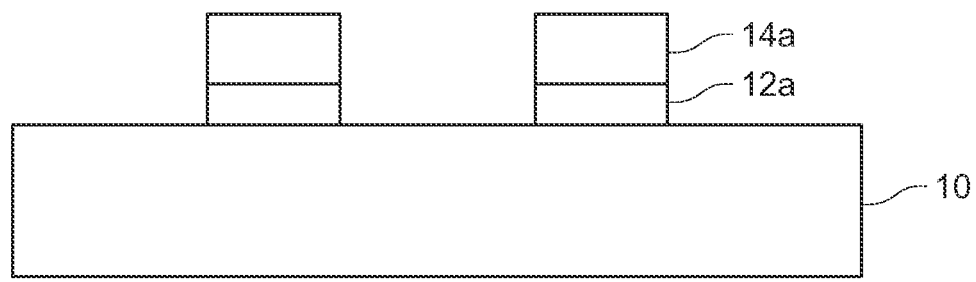
FIG. 1D illustrates a step in the process for creating the flexible electrical component that is subsequent to the step in FIG. 1C.

FIG. 1C illustrates the remaining copper layer outside the resist layer being removed (typically via a wet-etching process) from the underlying polyimide layer 12. Thus, only the copper pattern 12a underlying the cured resist layer 14a remains, as shown in FIG. 1D.

Figure 1E:
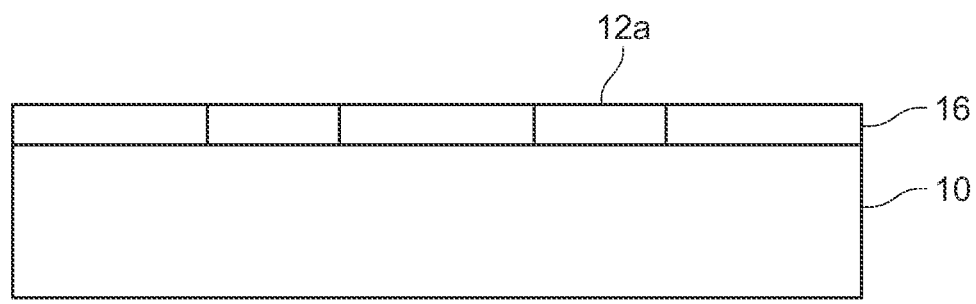
FIG. 1E illustrates a step in the process for creating the flexible electrical component that is subsequent to the step in FIG. 1D.
Figure 1F:
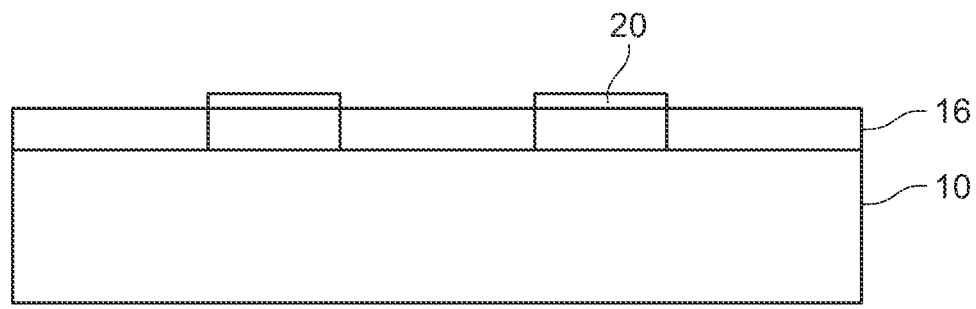
FIG. 1F illustrates a step in the process for creating the flexible electrical component that is subsequent to the step in FIG. 1E.

The cured resist layer 14a is removed (e.g., by a resist stripping process) and another mask layer 16 is placed around the copper pattern 12a, preferably at the about the same thickness as the copper pattern 12a, as shown in FIG. 1E. In regions where external electrical contact must be made with the copper pattern 12a, a gold plating having a thickness of about 0.06 mil (60 microinches) may be then added to copper pattern 12a to create a contact pad 20, as shown in FIG. 1F. In some embodiments, the no additional gold plating is needed to create the contact pad 20, or plating with materials other than gold may be used for the contact pad 20. The mask layer 16 is then removed, and the final contact pad 20 is now formed on the base polyimide layer 10, which serves as the starting part for creating fine openings above those copper contact pads 20 shown in FIG. 2A.

Figure 2A:
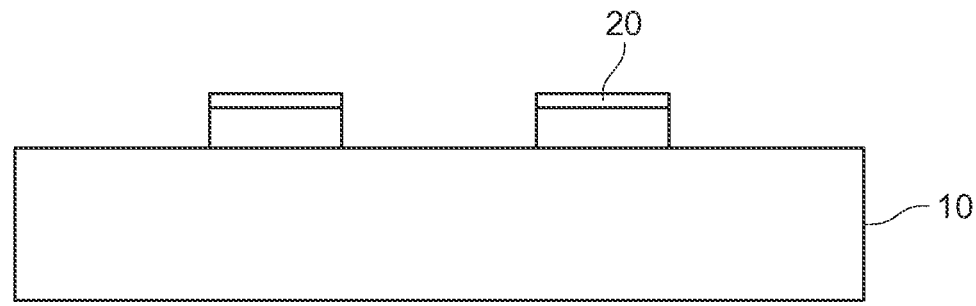
FIG. 2A illustrates an initial structure resulting from FIG. 1F on which fine openings will be created above the copper contact pads.

FIGS. 1A-1F illustrate one process for creating the contact pad 20 on a polyimide layer 10, which is shown as the starting structure of FIG. 2A. However, the plasma-etching process described below with respect to FIGS. 2B-2J can be used on other starting structures that were produced in a manner that is different from what has been described in the methods of FIGS. 1A-1F. The present invention contemplates that the copper contact pad 20 with the gold plating will have a thickness of 0.4 mil to about 2.9 mils, and that the polyimide layer 10 will have a thickness in the range of 0.5 mil to about 5 mils.

Figure 2B:
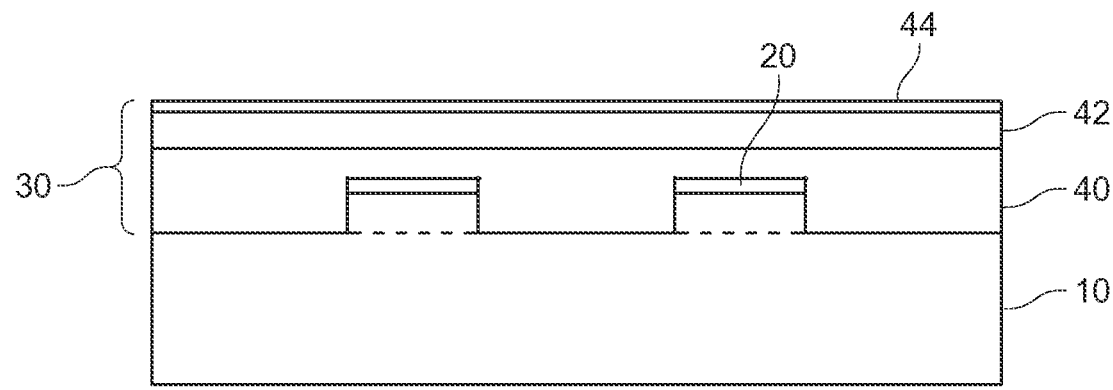
FIG. 2B illustrates a step in the process for creating fine openings above the copper contact pads that is subsequent to the step in FIG. 2A by applying a multi-part cover layer.

FIG. 2B illustrates applying a multi-part cover layer 30 on top of the contact pad 20 on the polyimide layer 10. In one embedment, the cover layer 30 is comprised of about 0.5 mils of the adhesive layer 40, about 0.5 mils of the polyimide layer 42, and about 2 microns of a copper mask layer 44. However, the present invention contemplates other thicknesses of these layers of the cover layer 30. The copper mask layer 44 typically has a very small chrome tie layer (on the order of Angstroms) on its lower surface that allows it to bond with the polyimide layer 41.

In FIGS. 2B-2J, the adhesive layer 40 is illustrated with an additional horizontal line (a drawing anomaly) at about the height of the gold playing layer on the contact pad 20, but the adhesive layer 40 is one unitary piece. Because the adhesive layer 40 extends over the uneven surfaces created by the contact pad 20 on the base polyimide layer 10, the adhesive layer 40 conforms around these surfaces and may have slight air-gaps, especially in the lowermost portions of the corners adjacent to the contact pads 20. The adhesive layer 40 is preferably acrylic.

Figure 2C:
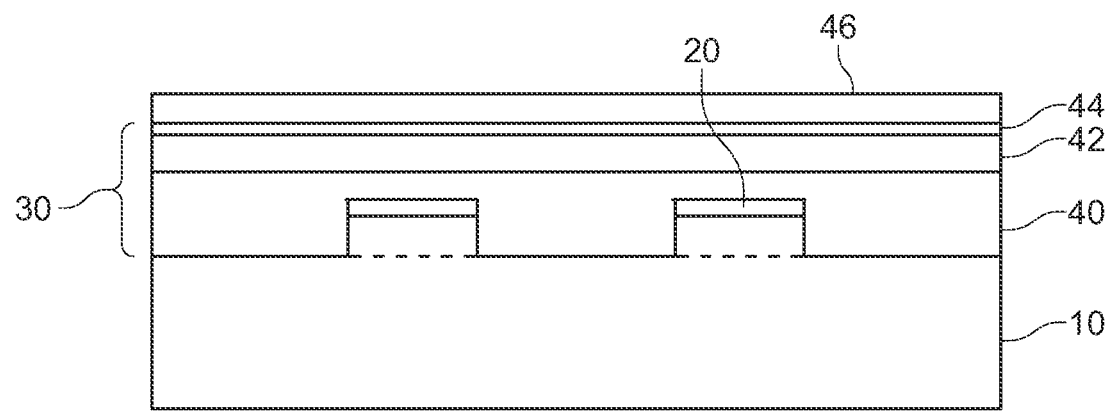
FIG. 2C illustrates a step in the process for creating fine openings above the copper contact pads that is subsequent to the step in FIG. 2B by applying a resist mask to the cover layer.
Figure 2D:
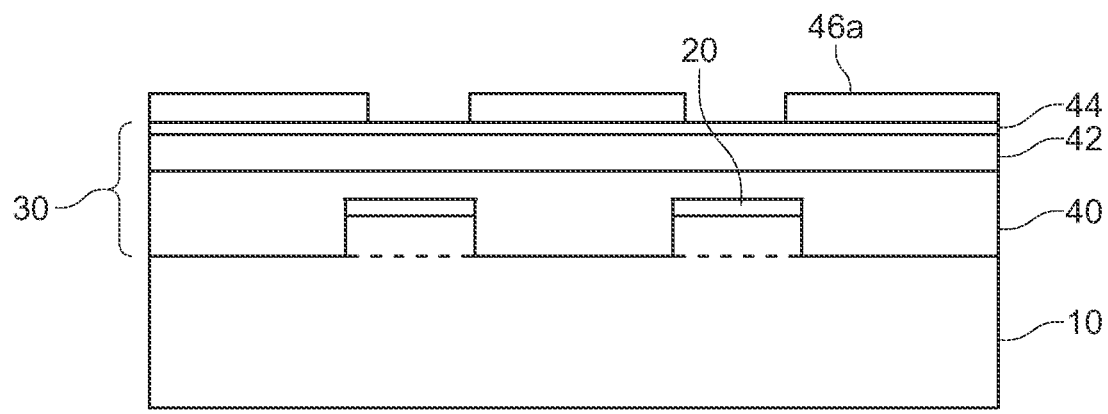
FIG. 2D illustrates a step in the process for creating fine openings above the copper contact pads that is subsequent to the step in FIG. 2C in which the resist mask is processed.

FIG. 2C illustrates the application of a photo-resist mask coating 46 over the copper mask layer 44 of the cover layer 30. The photo-resist mask coating 46 is then exposed to UV light and polymerized in certain regions to create a pattern. The uncured resist coating 46 can then be removed, leaving behind the desired pattern. As shown in FIG. 2D, the cured mask coating 46a is present in a first region generally located outside the area above the contact pads 20, but slightly overlapping the periphery of the contact pads 20. This overlap is explained below relative to FIG. 2I. The uncured portions of the original mask coating 46 have been removed from second regions directly above the contact pads 20, thereby exposing the copper mask layer 44 in those regions directly above the contact pads 20.

Figure 2E:
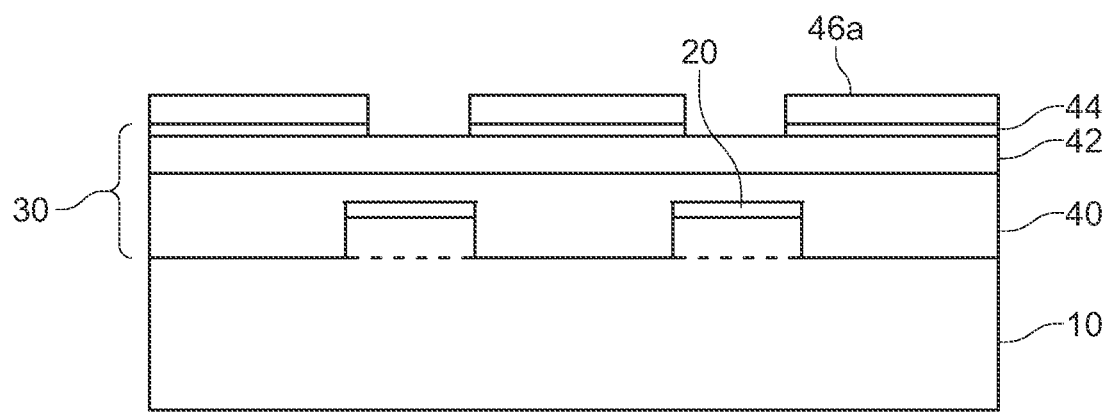
FIG. 2E illustrates a step in the process for creating fine openings above the copper contact pads that is subsequent to the step in FIG. 2D in which the copper layer of the cover layer is etched away.

FIG. 2E illustrates a step in the process in which the exposed portions of the copper mask layer 44 of the cover layer 30 are etched away by wet-etching. The copper layer 44 is removed by an acid etching process. The copper feature is etched to the nominal condition.

Figure 2F:
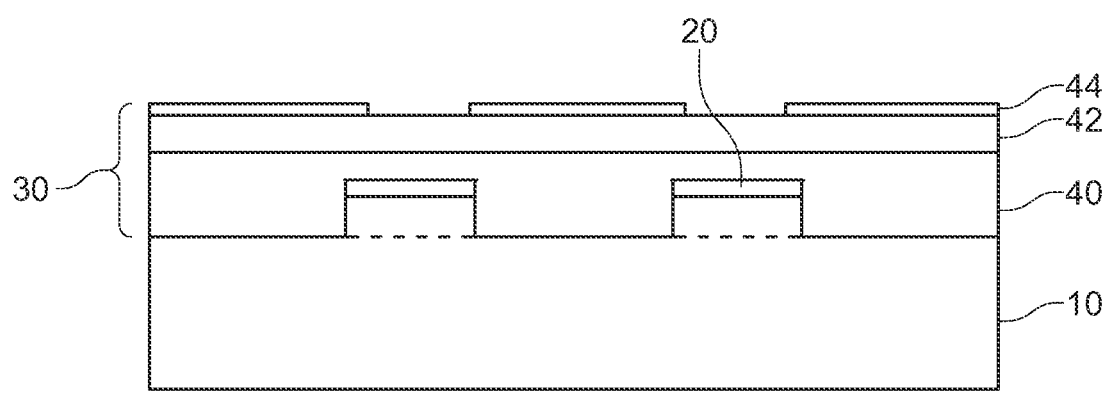
FIG. 2F illustrates a step in the process for creating fine openings above the copper contact pads that is subsequent to the step in FIG. 2E in which the remaining resist mask is removed from the upper copper layer.

As such shown in FIG. 2F, the cured resist mask coating 46a from FIG. 2E is removed from the copper mask layer 44 of the cover layer 30, leaving the remaining portion of the copper mask layer 44 exposed again. The resist mask coating 46a is removed by resist stripping process. The tie coat layer is then removed by Potassium permanganate chemistry.

Figure 2G:
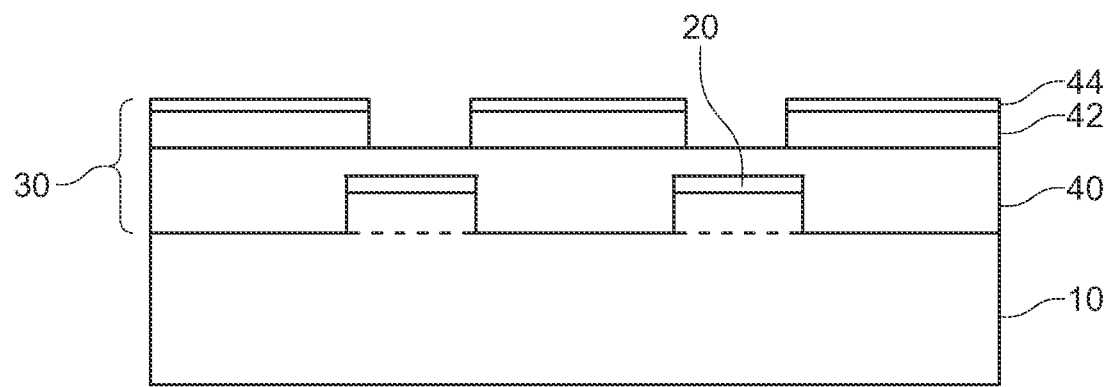
FIG. 2G illustrates a step in the process for creating fine openings above the copper contact pads that is subsequent to the step in FIG. 2F in which the polyimide layer of the cover layer is removed by plasma etching.
Figure 2H:
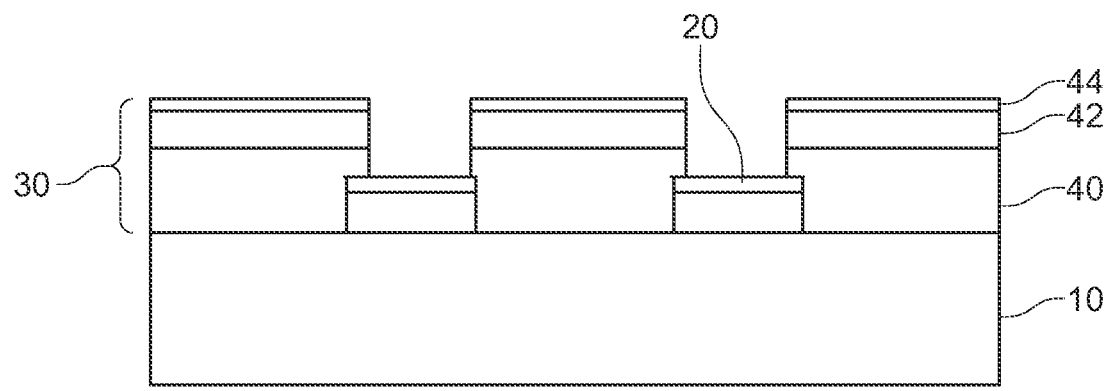
FIG. 2H illustrates a step in the process for creating fine openings above the copper contact pads that is subsequent to the step in FIG. 2G in which the adhesive layer of the cover layer is removed by plasma etching.

FIGS. 2G and 2H illustrate the removal of the polyimide layer 42 and the adhesive layer 40, respectively, via a plasma etching process above the contact pads 20. The copper mask layer 44 acts as a mask such that the plasma etching process only acts upon the polyimide layer 42 and the adhesive layer 40 in regions above the contact pads 20. The plasma etching process can be at various temperatures, can use multiple cycles, and can take various periods of time, depending on the thickness of the polyimide layer 42 and the adhesive layer 40 and mixtures used for the plasma etching. In one embodiment, the plasma-etching process to remove the polyimide layer 42 and the adhesive layer 40 was conducted in two cycles in accordance with the following table.

| TEMPERATURE | | TIME (mins) | RF (WATTS) | $CF_4$ (ccm) | $O_2$ (ccm) |
|---|---|---|---|---|---|
| 225° F.-235° F. | CYCLE 1 | 15 | 1500 | 0 | 1000 |
| | CYCLE 2 | 45 | 2500 | 300 | 700 |

In addition to the embodiment in the table above, the present invention contemplates Tetrafluoromethane (CF4) and Oxygen mixtures that include more Oxygen than CF4 by volume, such those mixtures having 10-40% CF4 and 60-90% Oxygen by volume. In addition to the embodiment in the table above, the present invention contemplates the use of other temperatures, such as a CF4 and Oxygen mixture that reacts in a temperature range between 210° F. and 250° F. The first cycle can include other mixtures that are substantially Oxygen, such as mixtures having greater than 90% Oxygen, greater than 95% Oxygen, greater than 97% Oxygen, or greater than 99% Oxygen by volume. Depending on these parameters, the overall process times can be reduced to be less 60 minutes, or less than 45 minutes.

Figure 2I:
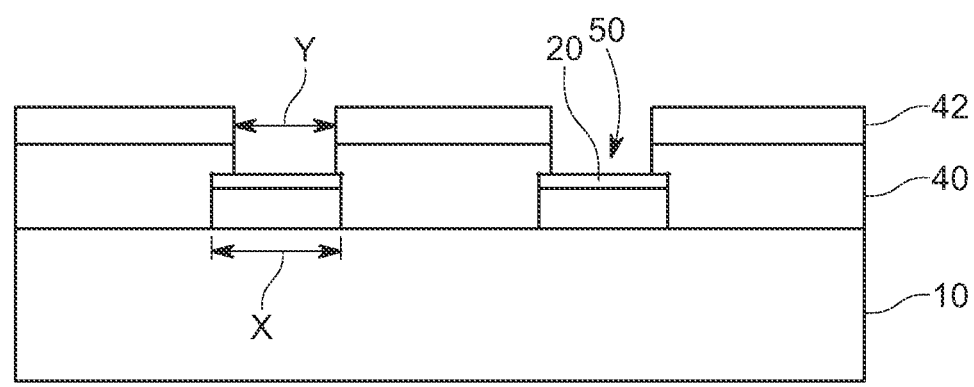
FIG. 2I illustrates a step in the process for creating fine openings above the copper contact pads that is subsequent to the step in FIG. 2H in which the upper copper layer of the cover layer is removed, yielding the completed electronic part.

FIG. 2I illustrates a step in which the copper mask layer 44 of the cover layer 30 has been removed with a wet-etching process, yielding the completed part having the openings 50 through the adhesive layer 40 and the polyimide layer 42. The tie coat layer is then removed by Potassium permanganate chemistry. The gold plated layer on the copper pad 20 is of sufficient thickness that the copper underneath is not attacked. The gold layer is not attacked by the wet chemistry used for copper etching. In summary, the cover layer 30 initially includes the copper mask layer 44, which serves to provide a masking function for the dry-plasma etching. However, the copper mask layer 44 is subsequently fully removed (as shown in FIG. 2I), leading to a modified cover layer than includes only the original adhesive layer 40 and the polyimide layer 42 in regions outside the contact pads 20.

It should be noted that the copper contact pad 20 has a maximum dimension of "X" and the opening 50 through the polyimide layer and the adhesive layer has a dimension "Y" that is less than the dimension "X". For example, this overlap distance ("X"–"Y") will lead to a border around the contact pad 20 that is in the range from about 0.2 mil to about 5 mils. The plasma-etching processes in accordance with the present invention produce fine openings 50 through the polyimide layer 42 and the adhesive layer 40 having maximum dimensions "Y" of less than 12 mils, preferably less than 10 mils, and most preferably less than 8 mils.

Figure 2J:
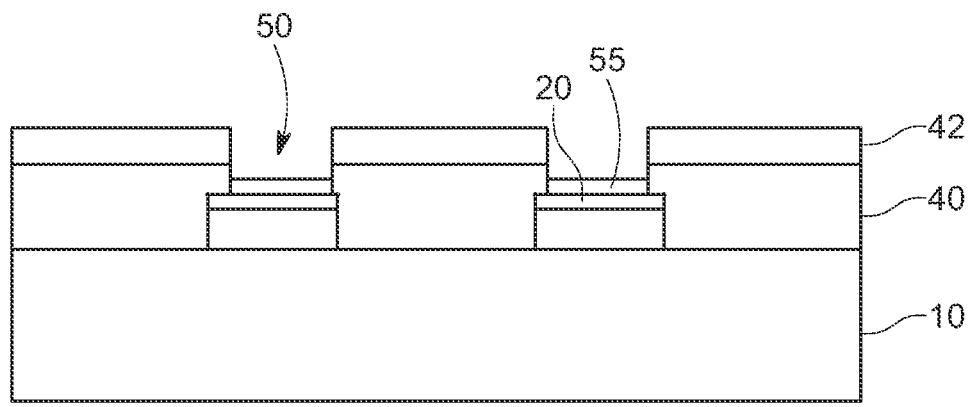
FIG. 2J illustrates an additional verification step subsequent to the step in FIG. 2I in which the exposed to contact pad 20 is plated to ensure the accuracy of the plasma-etching process.

FIG. 2J illustrates an additional verification step subsequent to the step in FIG. 2I in which the exposed contact pad 20 is plated with a finish plating 55 (e.g., tin or additional copper) to ensure the accuracy of the dry-etching process.

Figure 3:
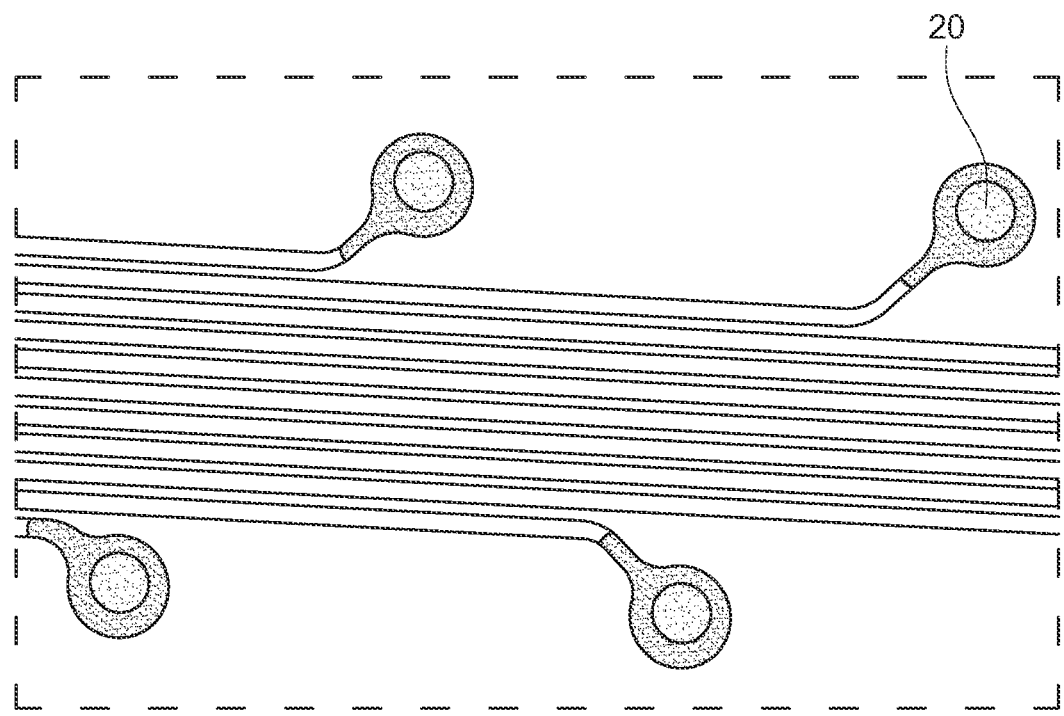
FIG. 3 illustrates generally circular openings leading to the four contact pads that were created in accordance with the plasma-etching methods of present disclosure.

FIG. 3 illustrates generally circular openings leading to the four contact pads 20 that were created in accordance with the methods described relative to FIGS. 2A-2J above. The openings 50 (See FIG. 2I) through the polyimide layer 42 and the adhesive layer 40 of the cover layer 30 from the plasma-etching process have a maximum dimension of about 8 mils (i.e., about 0.008 inch), although very fine openings less than 8 mils can be created. The traces leading to the contact pads 20, which have dimensions of about 1-2 mils, are also shown.

Figure 4:
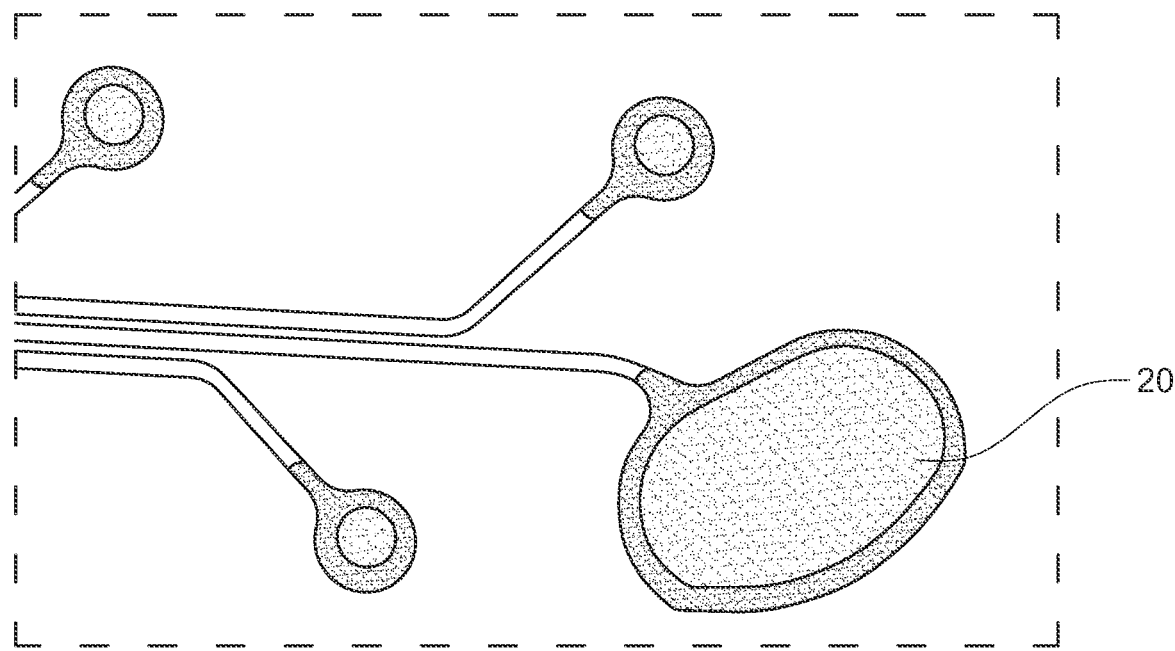
FIG. 4 illustrates three generally circular openings leading and a fourth larger opening that is more ovular shape created in accordance with the plasma-etching methods of the present disclosure.

FIG. 4 illustrates three generally circular openings and a fourth larger opening that is more ovular shape created in accordance with the methods described relative to FIGS. 2A-2J. The ovular-shaped larger opening has a minor dimension of about 30 mils and major dimension of about 60 mils. As such, the masking function of the copper mask layer 44 of the cover layer 30 can create shapes for openings that are other than generally circular.

Figure 5:
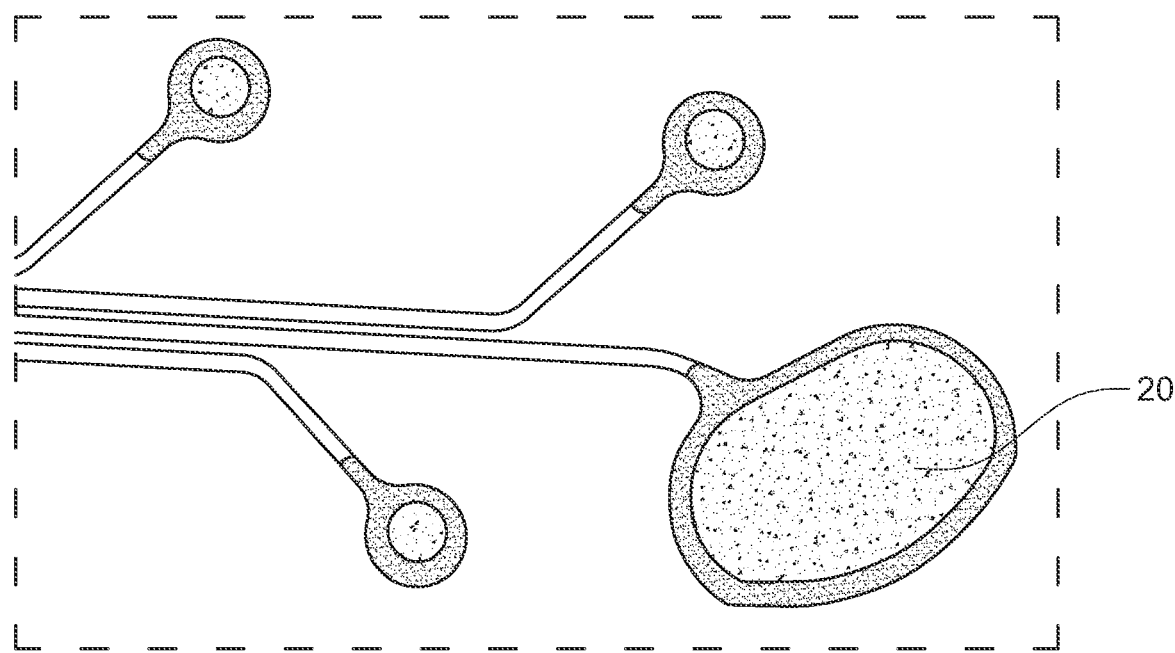
FIG. 5 illustrates a further plating for the openings in FIG. 4 to illustrate exact locations of the underlying contact pads that are visible through the openings.

FIG. 5 illustrates a further plating, as indicated with reference to FIG. 2J, for the openings in FIG. 4 to better illustrate the exact locations of the underlying contact pads 20 that are visible through the openings. The contact pads 20 are darker in color and the surrounding light-yellow features are parts of the copper contact pad 20 that are surrounding the opening, but can still be visualized through the polyimide layer 42 and the adhesive layer 40. In other words, consistent with FIG. 2J, the contact pad 20 has a maximum dimension of "X" and the opening 50 through the polyimide layer 42 and the adhesive layer 40 has a dimension "Y" that is less than the dimension "X". The thickness of the border ("X"–"Y"/2) around the contact pad 20 is in the range from about 0.2 mil to about 5 mils.

Figure 6:
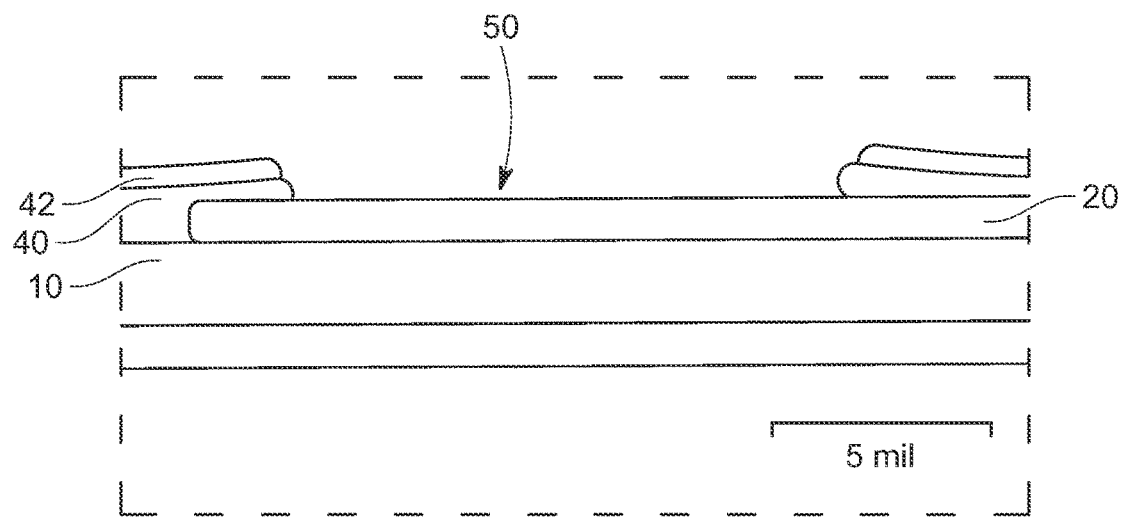
FIG. 6 illustrates a cross-sectional view through one of the openings created in accordance with the plasma-etching methods of the present disclosure.

FIG. 6 illustrates a cross-sectional view through one of the openings 50 created in accordance with the present disclosure. The opening 50 has a maximum dimension of about 12 mils. The contact pad 20 is lighter in color and is also attached to a trace on the right side of the image. The polyimide layer 42 and the adhesive layer 40 are slightly overlapping the edge of the contact pad 20 to create a boarder around the contact pad 20 of about 1-2 mils. In this embodiment, the base polyimide layer 10 includes a copper layer on its lower surface at the region of the cross-section.

Figure 7:
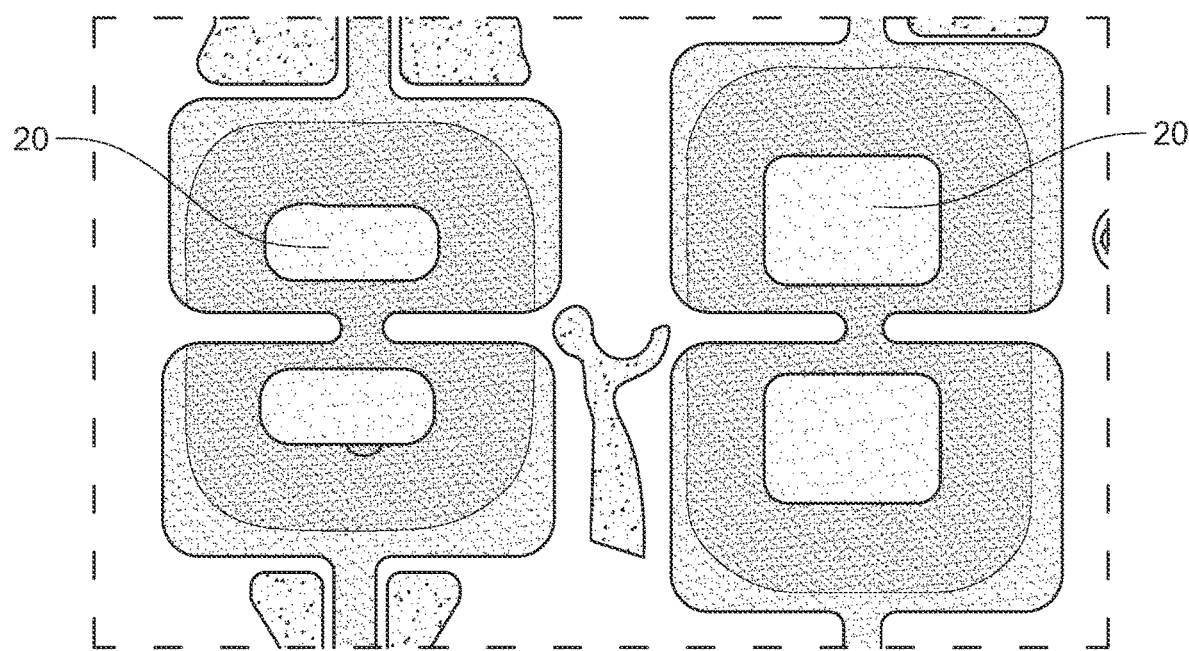
FIG. 7 illustrates the use of the plasma-etching process to create openings over the contact pads that are more rectangular in shape.

FIG. 7 illustrates the use of the plasma-etching process described above to create openings over the contact pads 20 that are more rectangular in shape. As shown in FIG. 7, the rectangles can have different aspect ratios. The rectangular pads 20 on the left side have approximate dimensions of 5 mils (0.0050") H×12 mils (0.0120") W and the rectangular pads on the right side have approximate dimensions of 9 mils (0.0090") H×12 mils (0.0120") W. The present invention also permits the creation of precise openings over contact pads 20 (or other recesses) that are more irregular in shape, such as serpentine shapes, star shapes, half-circle shapes, triangular shapes, and other polygonal shapes.

The present invention contemplates the use of multiple layers (multiple base polyimide layers) for the flexible electronic part, in which openings of various sizes and shapes are needed on both sides of the part. Further, the metallic contact pads that are made of materials other than copper and copper alloys are also contemplated. The present invention also contemplates the use on electronic parts that are not flexible, and on electronic parts having a base material that is other than polyimide. The electronic parts may be used in medical devices, wearable devices, automotive devices, and various sensors requiring exposure of one or more conductive surfaces.

These embodiments and obvious variations thereof is contemplated as falling within the spirit and scope of the claimed invention, which is set forth in the following claims. Moreover, the present concepts expressly include any and all combinations and subcombinations of the preceding elements and aspects.

We claim:

1. A method of providing access to a copper contact pad located on a flexible electronic part having a base polyimide layer, the copper contact pad located on the base polyimide layer, the method comprising:

covering the copper contact pad and the base polyimide layer with a cover layer comprising a copper mask layer, a polyimide layer, and an adhesive layer, the adhesive layer attaching the cover layer to the copper contact pad and the base polyimide layer, the copper mask layer being exposed;

covering the copper mask layer of the cover layer with a resist layer;

curing the resist layer with UV light in in a first region located outside the copper contact pad and removing the uncured resist layer in a second region directly above the copper contact pad, the first region at least partially surrounding the second region;

by use of a wet-etching process, removing a portion of the copper mask layer of the cover layer in the second region directly above the copper contact pad;

by use of a plasma-etching process, creating an opening through the polyimide layer and the adhesive layer of the cover layer within the second region, the opening leading to the copper contact pad, the copper layer of the cover layer in the first region layer acting as a mask for the plasma-etching process; and removing a remainder of the copper mask layer in the cover layer from the first region.

2. The method of claim 1, wherein the opening through the polyimide layer and the adhesive layer of the cover layer from the plasma-etching process has a maximum dimension of less than 12 mils, preferably less than 10 mils, and most preferably less than 8 mils.

3. The method of claim 1, wherein the plasma-etching process includes the use of a CF4 and Oxygen mixture.

4. The method of claim 3, wherein the CF4 and Oxygen mixture includes more Oxygen than CF4 by volume.

5. The method of claim 4, wherein the CF4 and Oxygen mixture is about 30% CF4 and 70% Oxygen by volume.

6. The method of claim 5, wherein the CF4 and Oxygen mixture is within a temperature range between 210° F. and 250° F. during the plasma-etching process.

7. The method of claim 5, wherein the plasma-etching process further includes plasma etching with a mixture that is substantially Oxygen that occurs before the plasma etching with the CF4 and Oxygen mixture.

8. The method of claim 1, wherein the cover layer is comprised of about 0.5 mils of the polyimide layer, about 0.5 mils of the adhesive layer, and about 2 microns of the copper mask layer.

9. The method of claim 1, wherein the copper contact pad includes a gold coating.

10. The method of claim 1, wherein the copper contact pad has a maximum dimension of "X", the opening through the polyimide layer and the adhesive layer has a dimension "Y" that is less than the dimension "X".

11. The method of claim 1, wherein the cured resist structure in the first region is removed by wet etching.

12. An electronic product with fine openings leading to a conductive layer made in accordance with any of the methods set forth in claim 1.

13. A method of providing access to a copper contact pad located on a flexible electronic part having a base polyimide layer, the copper contact pad located on the base polyimide layer, the method comprising:

covering the copper contact pad and the base polyimide layer with a cover layer comprised of a copper mask layer, a polyimide layer, and an adhesive layer, the adhesive layer attaching the cover layer to the copper contact pad and the base polyimide layer, the copper mask layer being exposed;

by use of a photo-resist process, removing a portion of the copper mask layer of the cover layer directly above the copper contact pad such that the removed portion of the copper mask layer is surrounded by an unremoved portion of the copper mask layer;

by use of a plasma-etching process that reacts through the removed portion of the copper mask layer, creating an opening through the polyimide layer and the adhesive layer of the cover layer, the opening leading to the copper contact pad, the unremoved portion of the copper mask layer acting as a mask for the plasma-etching process in the first region; and removing a remainder of the copper mask layer in the cover layer from the first region.

14. The method of claim 13, wherein the opening through the polyimide layer and the adhesive layer of the cover layer from the plasma-etching process has a maximum dimension of less than 12 mils, preferably less than 10 mils, and most preferably less than 8 mils.

15. The method of claim 13, wherein the plasma-etching process includes the use of a CF4 and Oxygen mixture.

16. The method of claim 15, wherein the CF4 and Oxygen mixture includes more Oxygen than CF4 by volume.

17. The method of claim 16, wherein the CF4 and Oxygen mixture is about 30% CF4 and 70% Oxygen by volume.

18. The method of claim 17, wherein the CF4 and Oxygen mixture is within a temperature range between 210° F. and 250° F.

19. The method of claim 17, wherein the plasma-etching process further includes plasma etching with a mixture that is substantially Oxygen that occurs before the plasma etching with the CF4 and Oxygen mixture.

20. The method of claim 13, wherein the cover layer is comprised of about 0.5 mils of the polyimide layer, about 0.5 mils of the adhesive layer, and about 2 microns of the copper mask layer.

21. The method of claim 13, wherein the copper contact pad includes a gold coating.

22. The method of claim 13, wherein the copper contact pad has a maximum dimension of "X", the opening through the polyimide layer and the adhesive layer has a dimension "Y" that is less than the dimension "X".

23. A method of forming an electronic part, comprising:

forming a copper contact pad on a base polyimide layer, the copper contact pad being located on the base polyimide layer; the base polyimide layer including a copper trace leading to the copper contact pad;

adding a cover layer to the copper contact pad and the base polyimide layer, the cover layer comprising a copper mask layer, a polyimide layer, and an adhesive layer, the adhesive layer attaching the cover layer to the copper contact pad and the base polyimide layer, the copper layer being exposed;

removing a portion of the copper mask layer of the cover layer directly above the copper contact pad such that the removed portion is surrounded by an unremoved portion of the copper mask layer;

by use of a plasma-etching process, creating an opening through the polyimide layer and the adhesive layer of the cover layer directly below the removed portion of the copper layer; the opening leading to the copper contact pad, the unremoved portion of the copper layer acting as a mask for the plasma-etching process.

24. A method of providing access to a contact pad located on an electronic part having a base polyimide layer, the contact pad located on the base polyimide layer, the method comprising:

covering the contact pad and the base polyimide layer with a cover layer comprised of a metallic mask layer, a polyimide layer, and an adhesive layer, the adhesive layer attaching the cover layer to the contact pad and the base polyimide layer, the metallic mask layer being exposed;

removing a portion of the metallic mask layer of the cover layer directly above the contact pad; and through the removed portion of the metallic mask layer, using a plasma-etching process to create an access opening to the contact pad through the polyimide layer and the adhesive layer.

\* \* \* \* \*